United States Patent
Astrauskas (10) Patent No.: US 10,520,548 B2
(45) Date of Patent: Dec. 31, 2019

(54) SYSTEM AND METHOD FOR OPTICALLY ISOLATED CURRENT OR VOLTAGE SENSING

(71) Applicant: Toshiba America Electronic Components, Inc., Irvine, CA (US)

(72) Inventor: Jurgis Astrauskas, St. Charles, IL (US)

(73) Assignee: Toshiba America Electronic Components, Inc., Irvine, CA (US)

( * ) Notice: Subject to any disclaimer, the term of this patent is extended or adjusted under 35 U.S.C. 154(b) by 220 days.

(21) Appl. No.: 15/785,960

(22) Filed: Oct. 17, 2017

(65) Prior Publication Data

US 2019/0113570 A1    Apr. 18, 2019

(51) Int. Cl.

| | | |
|---|---|---|
| G01R 31/317 | (2006.01) | |
| G01R 19/25 | (2006.01) | |
| G01R 19/32 | (2006.01) | |
| H02H 9/04 | (2006.01) | |
| G01R 15/22 | (2006.01) | |
| G01R 15/14 | (2006.01) | |

(52) U.S. Cl.
CPC ....... *G01R 31/31728* (2013.01); *G01R 15/14* (2013.01); *G01R 15/22* (2013.01); *G01R 19/25* (2013.01); *G01R 19/32* (2013.01); *H02H 9/045* (2013.01)

(58) Field of Classification Search
CPC ...... G01R 31/00; G01R 31/28; G01R 31/317; G01R 31/31728; G01R 19/00; G01R 19/25; G01R 19/2503; G01R 19/252; G01R 19/32; G01R 29/0842; H02H 9/00; H02H 9/04; H02H 9/045

USPC ...... 324/600, 602, 605, 607, 609, 76.11, 96, 324/97, 123 R, 123 C, 124

See application file for complete search history.

(56) References Cited

U.S. PATENT DOCUMENTS

| | | | | |
|---|---|---|---|---|
| 2004/0264982 | A1* | 12/2004 | Harres | H04B 10/697 398/209 |
| 2009/0323744 | A1* | 12/2009 | Tachigori | H01S 5/0683 372/38.02 |
| 2016/0173804 | A1* | 6/2016 | Borremans | H04N 5/3745 348/301 |
| 2017/0008022 | A1* | 1/2017 | deVos | C08K 3/36 |

* cited by examiner

*Primary Examiner* — Hoai-An D. Nguyen
(74) *Attorney, Agent, or Firm* — Ulmer & Berne LLP (57) ABSTRACT

A system and method for monitoring, testing or configuring electrical devices includes an input amplifier having an input connected to a device load line to generate an output linearly proportional to a voltage on the load line. An output of the input amplifier is connected to a photodiode in an optical path with a phototransistor. The phototransistor generates an output proportional to light generated by the photodiode, and this output is amplified and passed to an analog-to-digital converter. The converter generates a digital voltage level corresponding to the amplified output of the phototransistor. Digital temperature information is used to further enhance linearity of a generated digital voltage level. Multiple quantum well photodiodes further improve measurement linearity.

13 Claims, 8 Drawing Sheets

SYSTEM AND METHOD FOR OPTICALLY ISOLATED CURRENT OR VOLTAGE SENSING

TECHNICAL FIELD

This application relates generally to current or voltage sensing systems. This application relates more particularly to optically isolated current or voltage sensing systems for diagnostics, power consumption monitoring, system testing or efficiency monitoring.

BACKGROUND

Many systems, such as industrial or commercial controls, thermostats, appliances, factory automation products or heating, ventilating or air conditioning (HVAC) systems are configured, tested or monitored by monitoring of electrical properties. Today modern protection, control, and monitoring (PCM) systems consist of microprocessor-based multifunction relays.

Multifunction relays have built-in diagnostics that alarm for an internal failure, an important feature of the relay. However, the relay cannot test for a failure or misapplication of input or output. Misapplying an output contact can result in a breaker failure to trip, a failure to reclose, or a failure to perform a needed control action. Self-tests also miss human errors, such as applying the wrong voltage for digital input or connecting DC power outside the rating of the relay. Misapplying user programming functions can also cause misoperation. The following are some examples of these errors:

Failure to program a trip output contact to assert when the relay issues a trip command;
Wrong relay element programmed in the trip equation;
Wrong relay elements programmed in a pilot blocking scheme; or
Incorrect logic settings disable sensitive instantaneous overcurrent element for a hot-line condition;
Brownout conditions;
Incorrect directional element impedance setting in pilot blocking scheme; or
Incorrect phase rotation.

A particular example can be found a common home appliance, a washing machine. Modern washing machines are simple for users to operate, but engage in a complex array of device state controls to operate. Subsystems in washing machines must engage/disengage hot water input and cold water input. A motor must be controlled to agitate or spin. Draining must be enabled or disabled. Spinning may be faster or slower. A washer may have a heating element to heat or maintain a temperature of water used in the wash process. A washer must control when soap, fabric softener or bleach are added to a washing process. Mechanical motion is monitored. Alarms are generated for device malfunctions or status of a washing operation. Functions such as these are controlled with switches, relays, valves, transducers, sensors and user interfaces. Miswiring of electrical connections can result in device failure, or even injury.

Testing device configurations, such before a device leaves the factory, during device operation or after servicing, can be done by monitoring electrical characteristics. Such characteristics may check for short circuits or open circuits, the results of which can be compared to expected results for a particular device state. Voltage levels can also be monitored and compared with expected values.

SUMMARY

In accordance with an example embodiment of the subject application, a system and method for monitoring, testing or configuring electrical devices includes an input amplifier having an input connected to a device load line to generate an output linearly proportional to a voltage on the load line. An output of the input amplifier is connected to a photodiode in an optical path with a phototransistor. The phototransistor generates an output proportional to light generated by the photodiode, and this output is amplified and passed to an analog-to-digital converter. The converter generates a digital voltage level corresponding to the amplified output of the phototransistor.

In accordance with another example embodiment, digital temperature information is used to further enhance linearity of a generated digital voltage level.

In accordance with another example embodiment, multiple quantum well photodiodes further improve measurement linearity.

BRIEF DESCRIPTION OF THE DRAWINGS

Various embodiments will become better understood with regard to the following description, appended claims and accompanying drawings wherein:

DETAILED DESCRIPTION

The systems and methods disclosed herein are described in detail by way of examples and with reference to the figures. It will be appreciated that modifications to disclosed and described examples, arrangements, configurations, components, elements, apparatuses, devices methods, systems, etc. can suitably be made and may be desired for a specific application. In this disclosure, any identification of specific techniques, arrangements, etc. are either related to a specific example presented or are merely a general description of such a technique, arrangement, etc. Identifications of specific details or examples are not intended to be, and should not be, construed as mandatory or limiting unless specifically designated as such.

Configuration, monitoring or testing of devices, such as those noted above, can be accomplished with secondary systems that monitor voltage or current levels. It will be appreciated that voltage, current or power levels can be suitably measured or monitored. A concern with monitoring equipment is presented when measurements are taken within a same circuit as that of a device to be tested. An isolation system is advantageous for coupling an electronic measuring and display device to a device under test for making satisfactory electrical measurements while the device under test is being subject to high power electrical disturbances such as electromagnetic interference and/or electrostatic discharge. An optical connection suitably provides isolation between a test probe and other test equipment to eliminate electrical disturbances that may tend to compromise the accuracy of the test measurement.

Figure 1:
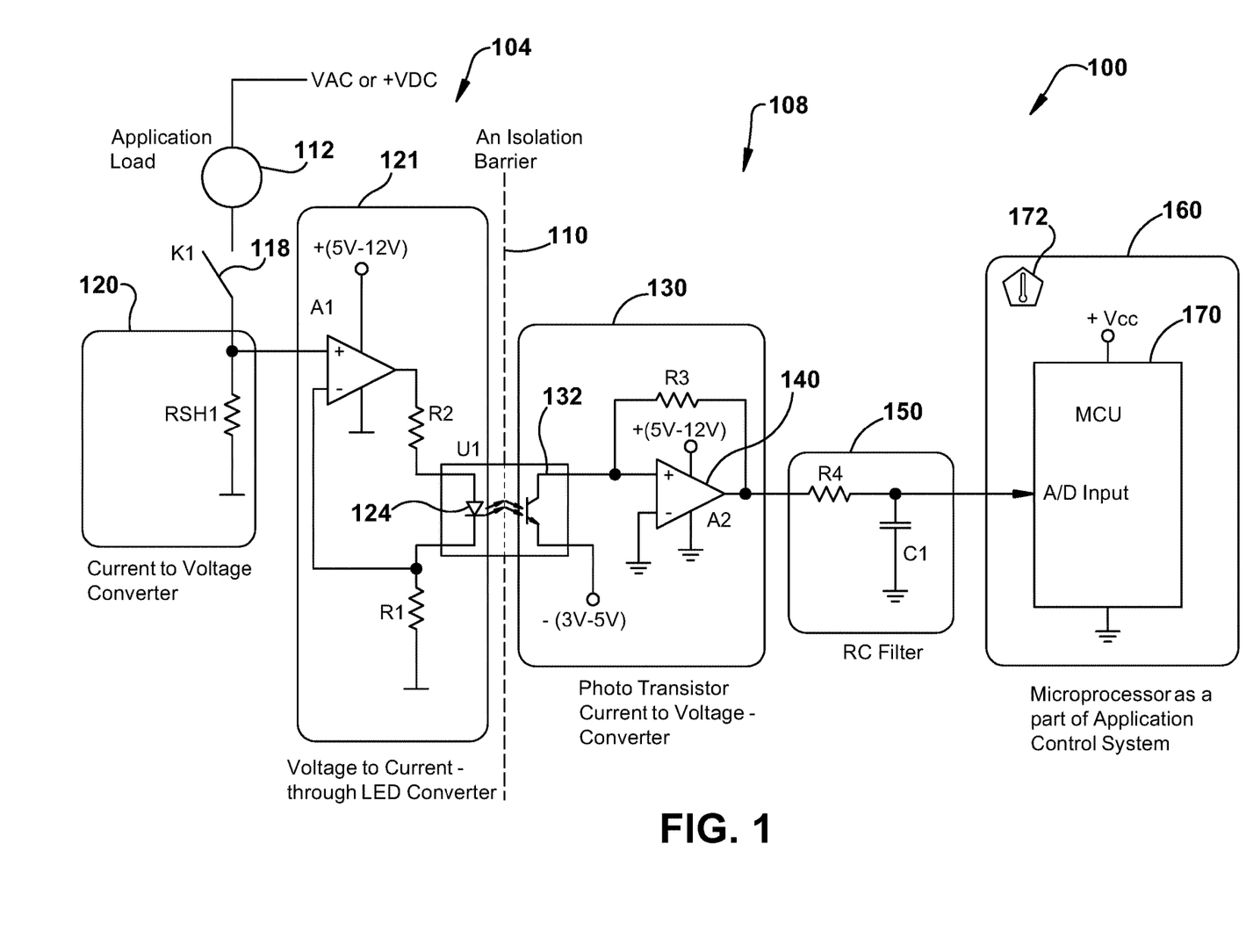
FIG. 1 is an example embodiment of an isolated amplifier monitoring system.

In accordance with the subject application, FIG. 1 illustrates an example embodiment of an isolated amplifier monitoring system 100 employing optical coupling between a circuit under test and testing circuitry. In the illustrated example, a device side 104 is electrically isolated from a testing or application control side 108 by isolation barrier 110. Device side 104 includes one or more application loads 112 and controls 118 such as switch K1. In the example, current to voltage converter 120 includes a shunt resistor RSH1 to establish a reference voltage from current passing through it. This reference voltage is provided to a non-inverting input of an operational amplifier (op-amp) A1 which forms a part of a voltage to current converter through light-emitting diode (LED), or photodiode 124, suitably powered and biased as will be understood by one of ordinary skill in the art. A suitable example op-amp can be found in product number TA75S01F from Toshiba. An output of op-amp A1 is communicated through resistor R2 to an anode of photodiode 124 of optical coupler U1. A cathode of photodiode 124 of optical coupler U1 is sent to ground though resistor R1 and into a inverting input of op-amp A1. Thus configured, light intensity from photodiode 124 can vary linearly with voltage changes over resistor RSH1 due to varying current flowing through it.

Testing side 108 includes a phototransistor current to voltage converter 130 that includes phototransistor 132 of optical coupler U1 that is fixed in a light path for light emitted from photodiode 124. A suitable packaged optical coupler U1 that includes photodiode 124 and phototransistor 132 is part number TLP293 from Toshiba. An emitter of phototransistor 132 is coupled to a suitable voltage source and a collector is coupled to a non-inverting input of op-amp A2, suitably biased and powered, and having its output also coupled to the non-inverting input of op-amp 140 through resistor R3. An inverting input of op-amp A2 is coupled to ground. It will be appreciated that ground for device side 104 is suitably electrically isolated from ground for testing side 108. Thus configured, phototransistor current to voltage converter 130 provides a linearly varying voltage corresponding to current through shunt resistor RSH1 of the current to voltage converter 120. This output is suitably applied to a filter, suitably a resistor/capacitor (RC) filter 150 comprising resistor R4 and capacitor C1. Filtered outputs provided to an analog to digital converter for a microprocessor of an application control system 160, suitably comprising a microcontroller unit (MCU) 170. Application control system 160 can include a suitable temperature sensor 172.

Current sensing or Input Voltage signal transfer to the secondary, or isolated, side is suitably performed by using multiple quantum well (MQW) diode technology operating in a linear collector current/input forward voltage (IC/IF) region (IF in a 0.1 mA to 2 mA-10 mA range. Any suitable part G+ ranking with current transfer ratio (CTR) of 150-300 can be used so as to provide +/−30% accuracy.

Accuracy can be further improved by using screened, CTR selected devices suitable to reach ~1%-2% accuracy, or greater, by implementing a calibration procedure on the testing side. A suitable calibration procedure can be performed and correction CTR values stored, for example inside ROM of MCU 170.

Figure 2:
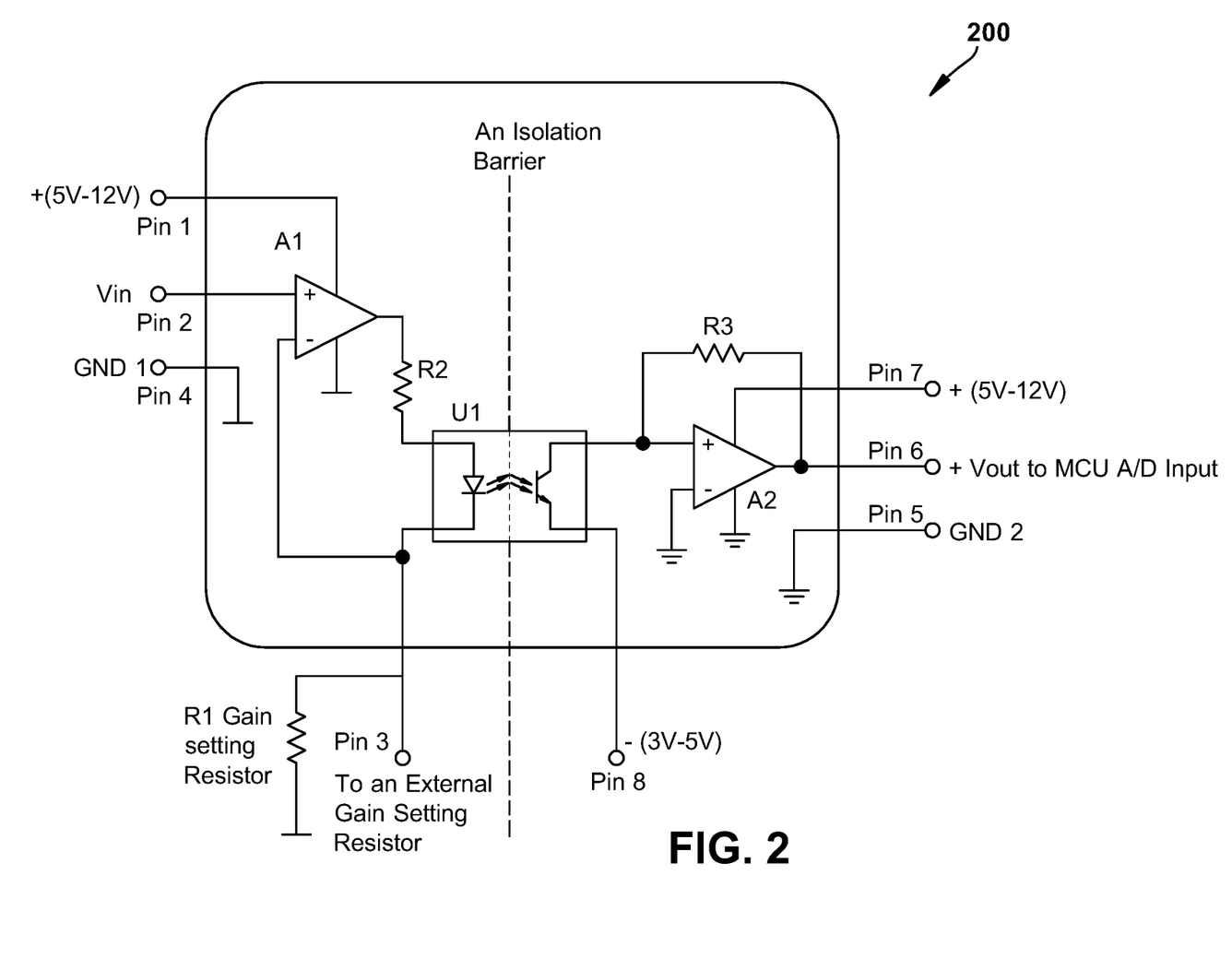
FIG. 2 is an example embodiment of a packaged isolated amplifier.

Turning now to FIG. 2 illustrated is an example embodiment of a packaged isolated amplifier 200 including a voltage to current converter through LED and a phototransistor current to voltage converter as illustrated in FIG. 1.

Figure 3:
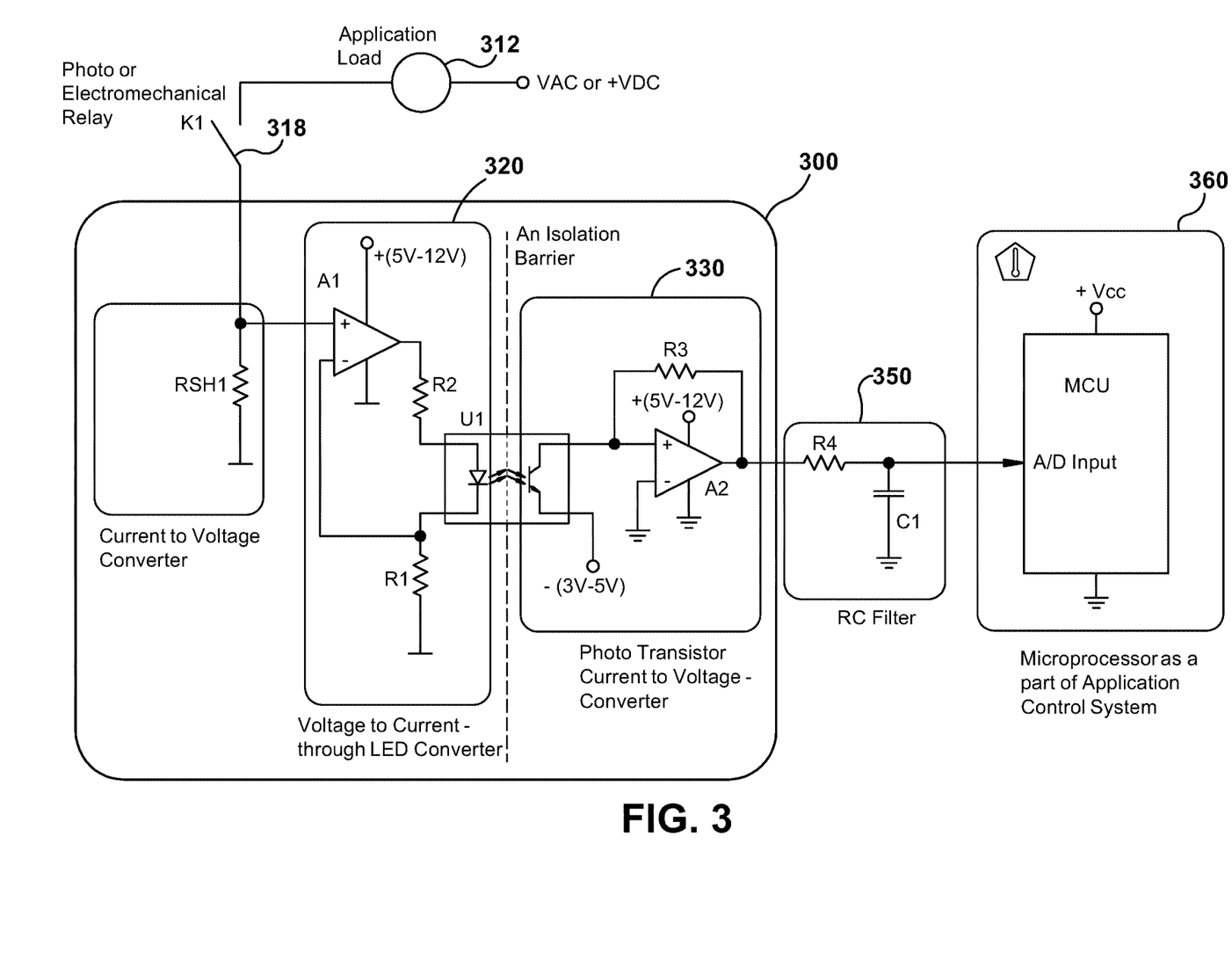
FIG. 3 is an example embodiment of an isolated current sensor package.

FIG. 3 illustrates an example embodiment of an isolated current sensor package 300 that includes current to voltage converter 320, voltage to current through LED converter 321 and phototransistor current to voltage converter 330 as described above. Isolated current sensor package 300 is suitably coupled with a load 312, switch 318, RC Filter 350 and MCU 360 as described above.

Figure 4:
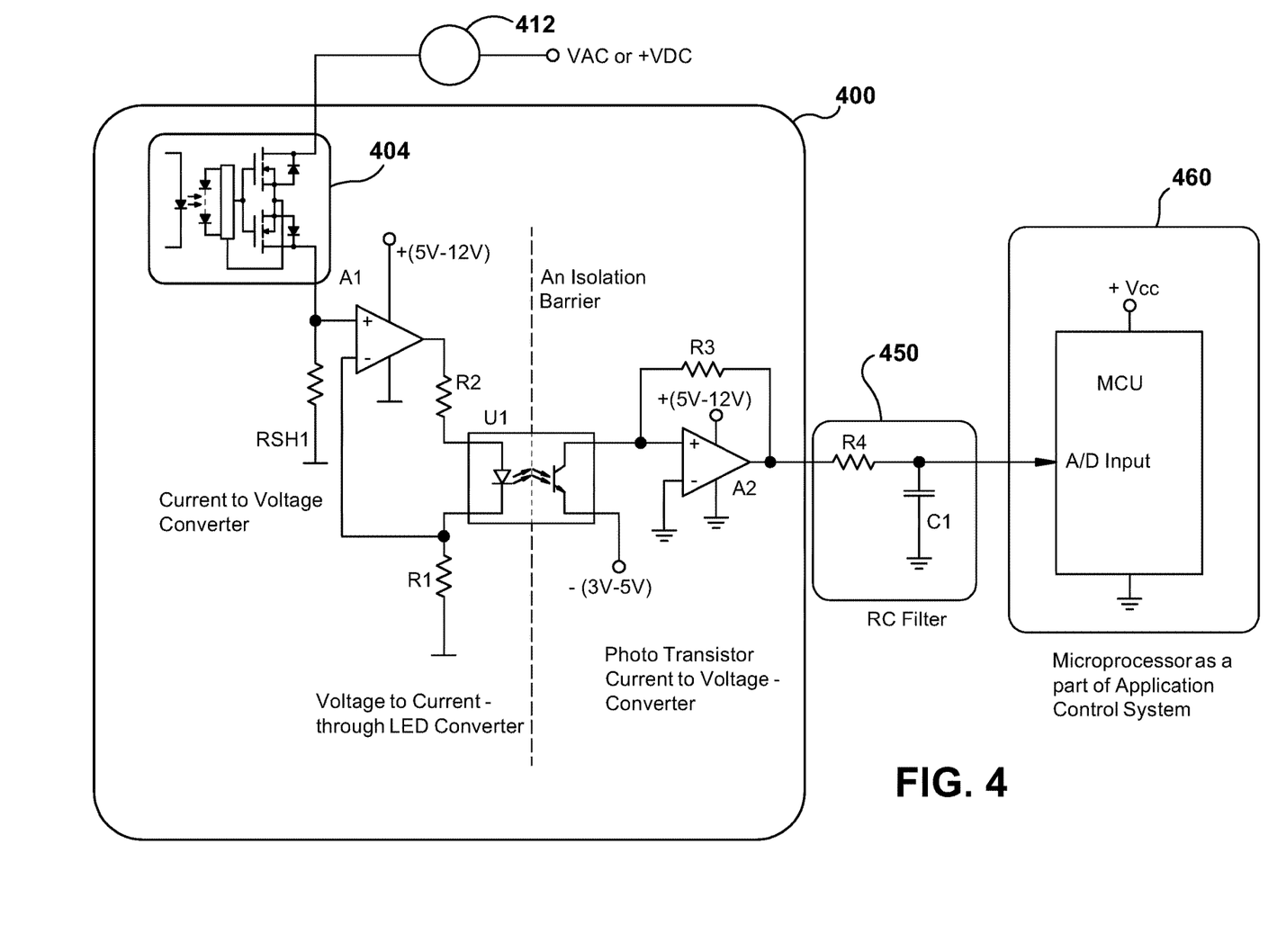
FIG. 4 is an example embodiment of an isolated current sensor package.

FIG. 4 illustrates an example embodiment wherein a package 400 includes a current to voltage converter, voltage to current converter through LED and a phototransistor current to voltage converter as described above, and is also provided with a photo-relay 404 in line with a non-inverting input of op-amp A1, which is also in line with load 412 for testing. An example photo-relay 404 can include a solid-state, or semiconductor, switch that uses an associated photodiode as part of the control gate. The photo-relay 404 selectively connects the package 400 to a conductor associated with the load 412 under test. RC filter 450 and MCU 460 are illustrated as described above. Package 400 provides a solution for diagnostics and system testing, monitoring of system load, power consumption, efficiency calculation, and the like.

Figure 5:
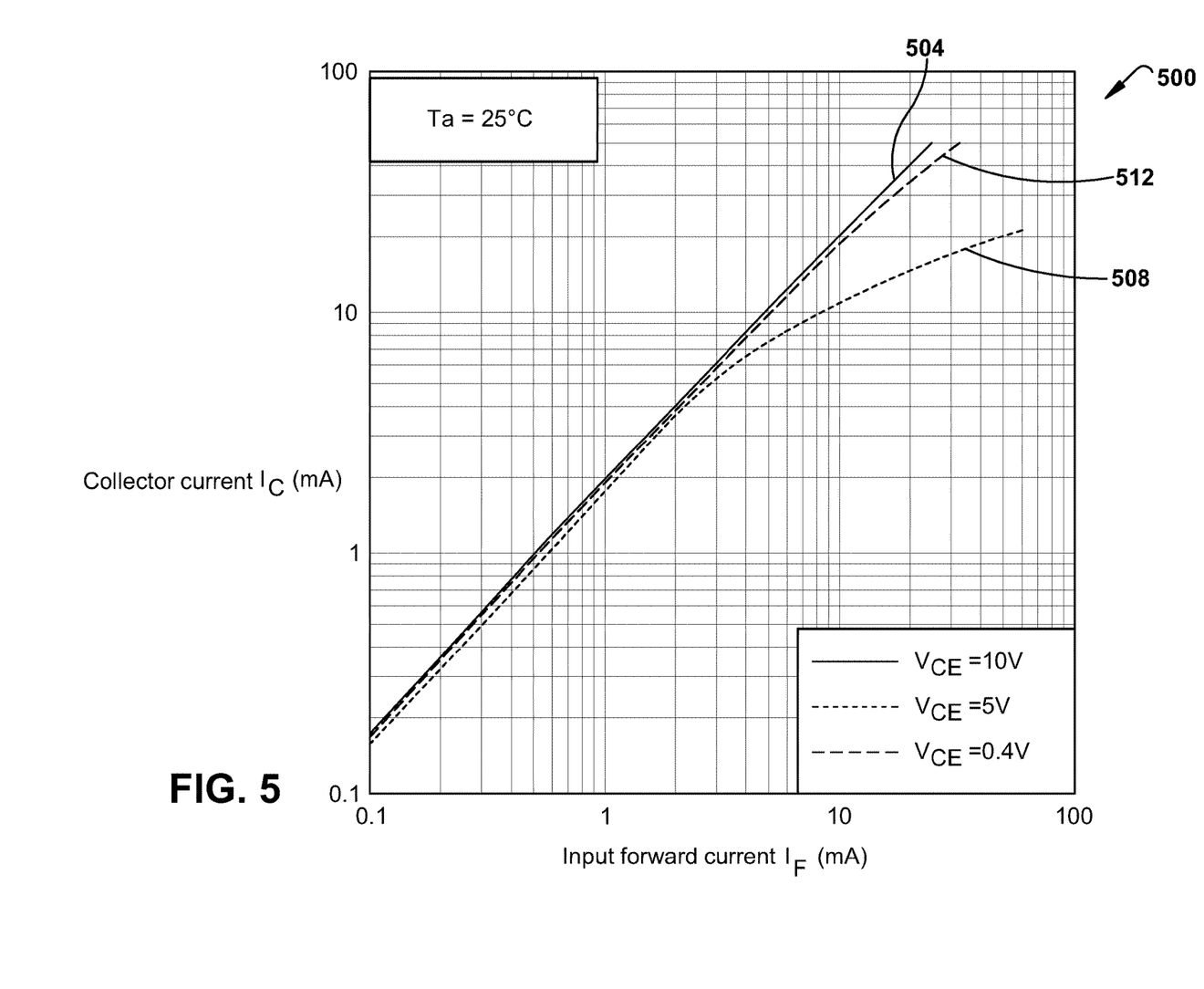
FIG. 5 is an example embodiment of collector current versus input forward voltage for a multiple quantum well photodiode.

FIG. 5 illustrates a graph 500 of collector current of a phototransistor versus input forward current for a suitable MQW photodiode as described above. Ideal linearity for the collector current versus the input forward current, as illustrated by line 504, is realized by applying higher voltages to the phototransistor, however this can limit the range of usable input forward current by the MQW photodiode. When lower voltages are used by the phototransistor, the MQW photodiode can use a wider range of input forward current, however linearity, as illustrated by line 508, will be noted to deviate substantially from the ideal linearity as the input forward current is increased. Line 512 illustrates acceptable linearity over a suitable range of input forward current by applying a moderate voltage to the phototransistor. Further improved linearity may be achieved by use of temperature related compensation as detailed herein.

Figure 6:
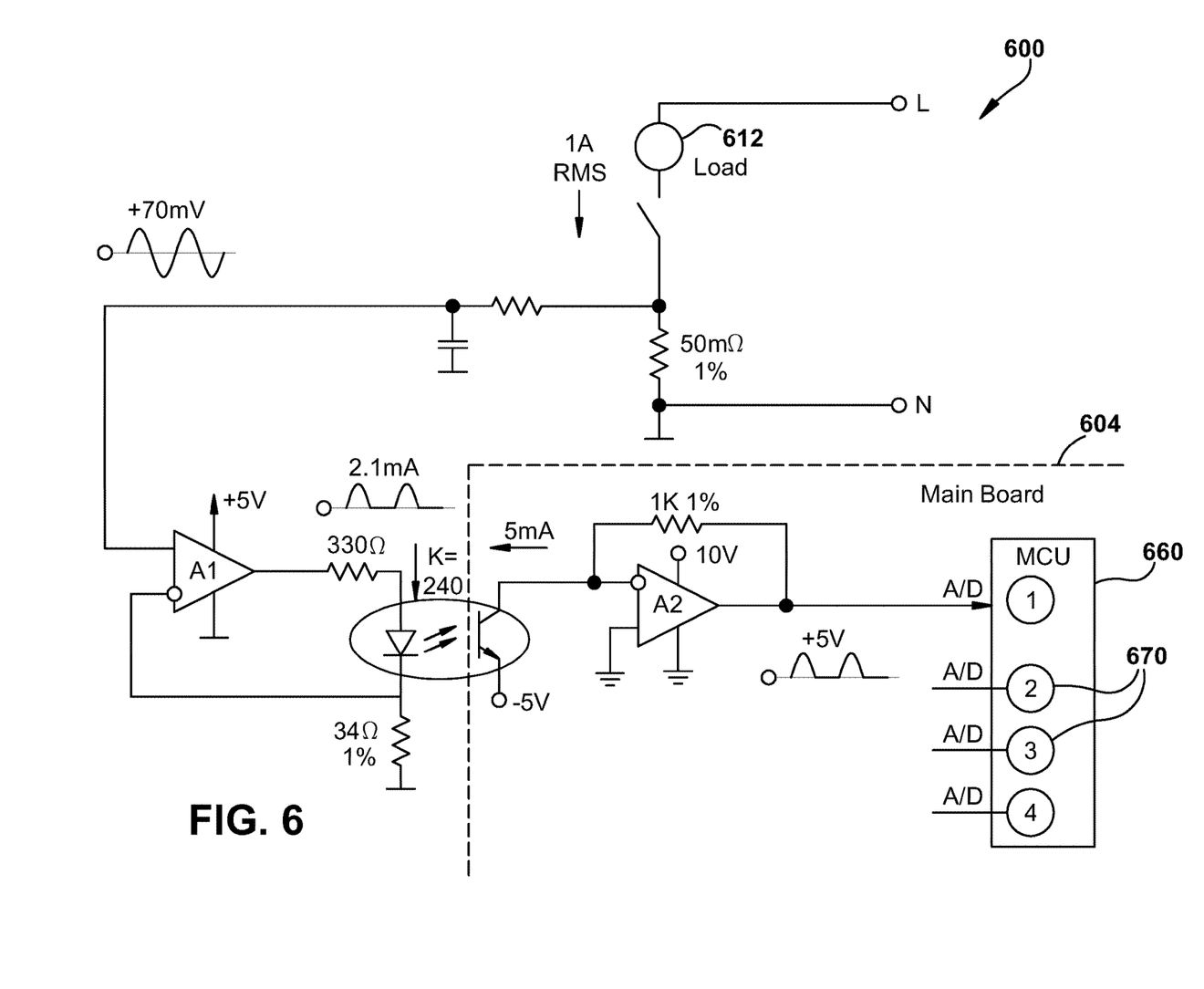
FIG. 6 is an example embodiment of an isolated current sensor system.

FIG. 6 illustrates an example embodiment of a system such as that described above embodying packaged main board 604 that includes a control side as detailed above, and incorporates MCU 660 provided with multiple analog to digital inputs 670, suitable to allow for multiple monitoring operations employing multiple optically coupled circuits.

Figure 7:
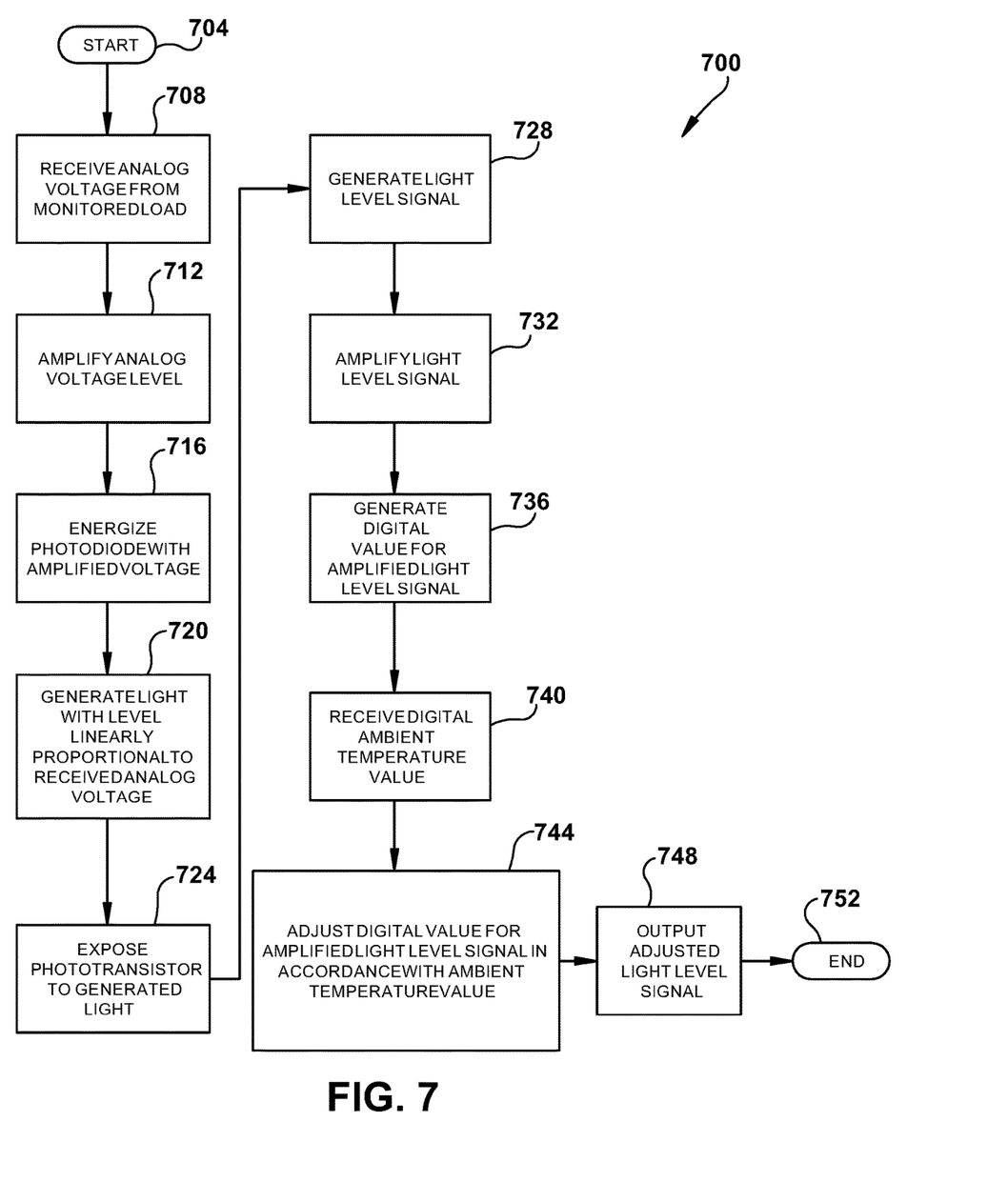
FIG. 7 is an example embodiment of a monitoring operation.

FIG. 7 is a flowchart 700 of an example embodiment of a monitoring operation as detailed herein. The process commences at block 704 and analog voltage input is received from a monitored load at block 708. A resultant signal is amplified at block 712, and the amplified signal used to energize a photodiode at block 716. Light is generated by the photodiode at block 720 which is linearly proportional to monitored analog voltage. Resultant light is exposed to a phototransistor at block 724 and a light level signal generated to block 728. This light level signal is amplified at block 732 and a digital value generated from it at block 736. Temperature information, such as ambient temperature or temperature within a package is received at block 740 and digital adjustment for linearity calculated at block 744. An adjusted, linear level is output at block 748 and the process ends at block 752.

Figure 8:
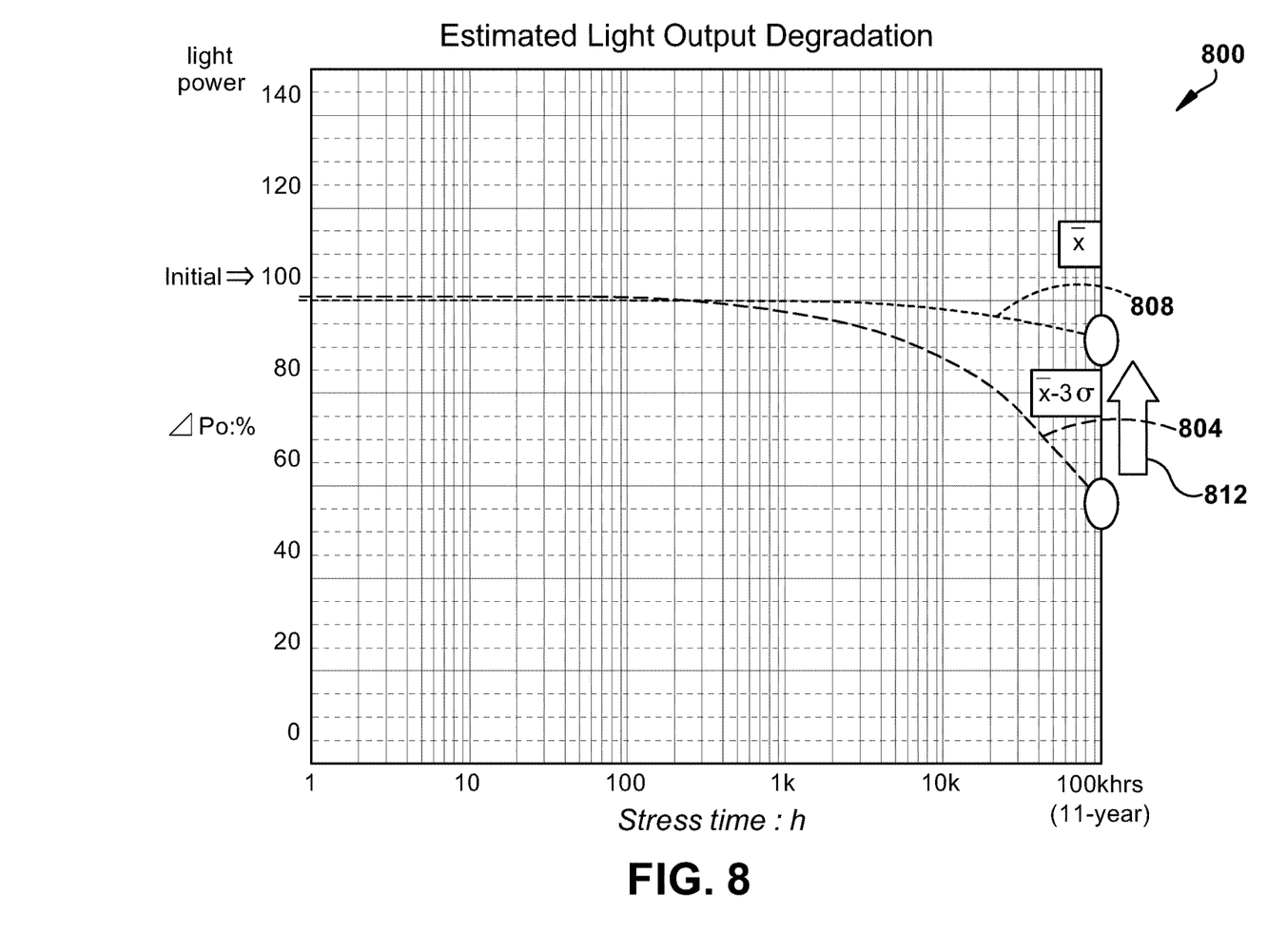
FIG. 8 is an example graph showing degradation of light output from a conventional photodiode compared to a long life photodiode.

FIG. 8 illustrates an example graph 800 showing degradation of light output from a conventional photodiode at 804, compared to a long life photodiode at 808, such as an MQW diode as described above. A suitable MQW diode is comprised of gallium-aluminum-arsenic (GaAlAs). An example photocoupler can be found in part no TLP183 from Toshiba. In graph 800, improvement is denoted by arrow 812.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the spirit and scope of the inventions.

What is claimed is:

1. An optically isolated sensing system comprising:
    an input connector configured to receive an input voltage;
    an output connector configured to output an output voltage linearly proportional to the received input voltage;
    a photodiode having an anode and a cathode;
    a ground connector configured to be connected to ground;
    a first operational amplifier including,
        a first operational amplifier output in electrical connection with the anode,
        a first operational amplifier inverting input in electrical connection with the cathode and the ground connector, and
        a first operational amplifier non-inverting input in electrical connection with the ground connector and the input connector;
    a phototransistor, having a collector and an emitter configured for electrical connection with an associated voltage source, the phototransistor secured proximate the photodiode in a light path with the photodiode;
    an isolated ground connector electrically isolated from the first ground connector; and
    a second operational amplifier electrically isolated from the first operational amplifier including,
        a second operational amplifier output in electrical connection with the output connector,
        a second operational amplifier non-inverting input in electrical connection with the collector and the second operational amplifier output, and
        a second operational amplifier inverting input in electrical connection with the isolated ground connector.

2. The system of claim 1 further comprising a shunt resistor disposed in an electrical path between the first operational amplifier non-inverting input and ground such that the input voltage corresponds to a voltage drop across the shunt resistor.

3. The system of claim 2 further comprising a switch configured to selectively make an electrical connection between an associated application load and the shunt resistor.

4. The system of claim 3 further comprising an analog-to-digital converter having an input in electrical connection with the output connector and configured to generate a digital voltage output corresponding to the output voltage.

5. The system of claim 4 further comprising a microcontroller including:
    a temperature sensor configured to generate a digital temperature output corresponding to a temperature proximate to the microcontroller;
    an input configured to receive the digital voltage output; and
    a processor and associated memory configured to generate an adjusted digital voltage output in accordance with the received digital voltage output and the digital temperature output.

6. The system of claim 1 further comprising a photo relay configured to switch an associated conductor in accordance with a sensed light level, wherein the conductor is electrically connected to the non-inverting input of the first operational amplifier.

7. The system of claim 6 wherein the conductor is configured to be electrically connected to an associated application load.

8. A system comprising:
    an input amplifier having an input connected to a load line so as to generate an output linearly proportional to a voltage on the load line;
    a photodiode connected to the output of the input amplifier;
    a phototransistor configured to receive light from the photodiode so as to generate an output proportional to the light generated by the photodiode;
    an output amplifier configured to amplify the output of the phototransistor; and
    an analog-to-digital converter configured to generate a digital voltage level corresponding to the amplified output of the phototransistor.

9. The system of claim 8 further comprising:
    a digital temperature sensor; and
    a processor and associated memory configured to generate a modified digital voltage level in accordance with the digital voltage level and an output of the digital temperature sensor.

10. The system of claim 8 further comprising a photo relay having a first terminal connected to the input of the input amplifier and a second terminal connected to an application load.

11. The system of claim 8 wherein the photodiode is comprised of a multiple quantum well diode.

12. The system of claim 8 further comprising a shunt resistor configured to generate the voltage on the load line in accordance with current passing therethrough.

13. The system of claim 12 wherein the input amplifier and the output amplifier are electrically isolated, and wherein the input amplifier and the output amplifier are each comprised of an operational amplifier.

* * * * *